United States Patent [19]

Hyltin

[11] 4,277,784
[45] Jul. 7, 1981

[54] SWITCH SCANNING MEANS FOR USE WITH INTEGRATED CIRCUITS

[75] Inventor: Tom M. Hyltin, Dallas, Tex.

[73] Assignee: Commodore Electronics Limited, Nassau, The Bahamas

[21] Appl. No.: 57,166

[22] Filed: Jul. 13, 1979

[51] Int. Cl.³ .............................................. G08B 5/36
[52] U.S. Cl. ..................................... 340/711; 236/47; 340/365 R; 340/765; 340/802
[58] Field of Search ............... 340/711, 708, 802, 765; 236/47; 200/16 R

[56] References Cited

U.S. PATENT DOCUMENTS

| | | | |
|---|---|---|---|
| 3,651,509 | 3/1972 | Ngo | 340/708 |
| 3,737,594 | 6/1973 | Rosmanith | 200/16 R |
| 3,917,165 | 11/1975 | Cross | 236/46 |
| 3,918,041 | 11/1975 | Mao | 340/765 X |
| 3,942,718 | 3/1976 | Palmieri | 236/78 R |
| 4,014,012 | 3/1977 | Caudel | 340/711 X |
| 4,070,664 | 1/1978 | Abe | 340/711 |
| 4,071,745 | 1/1978 | Hall | 364/104 |
| 4,079,366 | 3/1978 | Wong | 236/47 X |

*Primary Examiner*—David L. Trafton
*Attorney, Agent, or Firm*—Hubbard, Thurman, Turner, Tucker & Glaser

[57] ABSTRACT

Method and apparatus for generating a digital data word representative of the position of a switch element which is selectively engageable with one of a plurality of driver conductors which are utilized for conducting actuating signals from a source to a data display system of the type having a plurality of display elements for visually indicating alphanumeric data. The display elements have visually perceptible and imperceptible data indicating states and are characterized by a lagging response to either the application or interruption of the actuating signal wherein a turn-on or turn-off transition interval elapses during a change from one state to the other with the preexisting state of the display element appearing to an observer to remain unchanged during the transition interval. The actuating signals are periodically applied during a load energizing interval through one or more of the driver conductors and are interrupted during a sampling interval. The load energizing interval is much longer in duration relative to the duration of the sampling interval, with the duration of the sampling interval being substantially less than the duration of the turn-off transition interval. Each driver conductor is sequentially pulsed during the sampling interval with a strobe signal having a pulse component duration which is substantially shorter than the turn-on time of the display elements. A number of repetitive events are counted which occur during the interval commencing with the first application of a strobe pulse to a driver conductor of the array and terminating with the application of a strobe pulse to the driver conductor engaged in electrical contact with the data input conductor through the movable switch element. The number of repetitive events counted during the sampling interval is proportional to the number of strobe pulses applied to the driver conductors during the sampling interval and is therefore representative of the position of the movable switch element.

13 Claims, 14 Drawing Figures

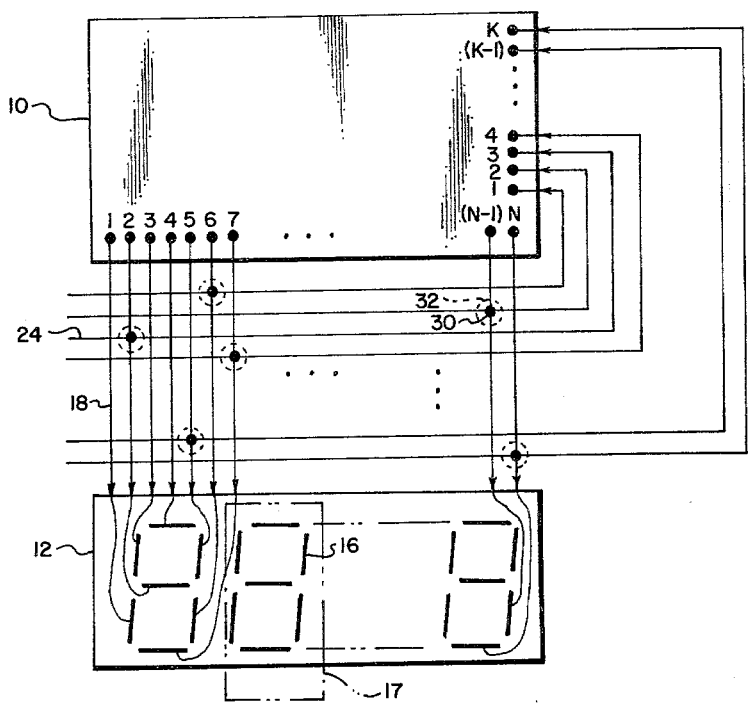
FIG. 1
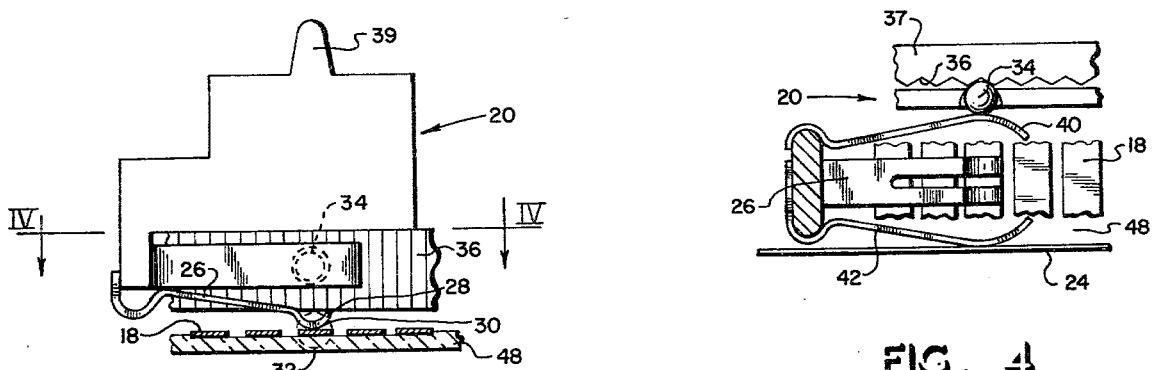
FIG. 3
FIG. 4
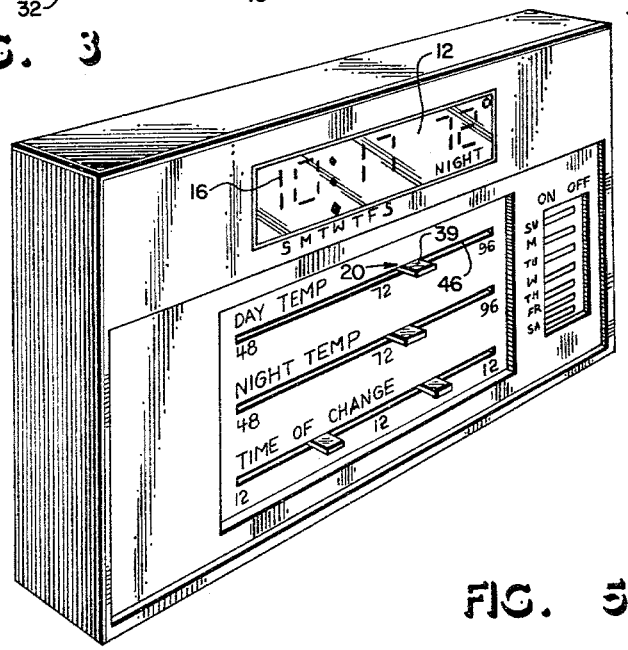
FIG. 5

SWITCH SCANNING MEANS FOR USE WITH INTEGRATED CIRCUITS

BACKGROUND OF THE INVENTION

1. Field of the Invention

The present invention relates generally to electrical switch apparatus and in particular to a multiplex switch system which may be used in combination with existing conductors for transmitting information to be used for the control of a remote operation.

2. Description of the Prior Art

Many advanced electronic devices, such as calculators, require digital displays as well as complex data inputs through keyboard or other types of switches. Because the cost of the integrated circuit bears a direct relationship to the physical size of the integrated circuit, means have been developed for sharing lines to serve both the function of driving the digital display elements and interrogating the keyboard. These techniques have been limited in the past to displays such as the light emitting diode (LED) variety which operate from direct current and which are digit-by-digit multiplexable. Similar sharing techniques have not been available for use with displays requiring continuous alternating current drive, such as the liquid crystal display (LCD). Although the LCD displays require continuous drive on all segments they generally have relatively slow response, typically on the order of a few hundredths of a second to change from dark to light or light to dark.

Therefore, it is the principal object of the present invention to provide a multiplex switching system which can be combined with existing conductors which drive visual display elements of an LCD digital data display system for indicating the setting of a movable switch element such as a touch pad of a keyboard.

There are a number of important applications in which it is desirable to input a large amount of information through a slide bar type switch into an electrical circuit such as an integrated circuit of a microprocessor. An example of such an application is a digital electronic thermostatic controller for home, office and business air conditioning and heating control applications. Such a thermostatic control requires a large number of data inputs including selection of temperature over a 40° to 50° temperature range. This information can be fed into a thermostatic controller in digital form with a keyboard input device, but to gain broad market acceptance, minimize setting errors and have all the settings apparent or "intuitively obvious" at all times, an analog or "sliding bar" type of input is desirable. With such an arrangement, less operator training is required, less reliance on instruction manuals is needed, and in business applications, the settings can be determined through a clear plastic cover which may be locked over the thermostat control unit to prevent tampering.

However, with a conventional sliding bar type of input arrangement, to bring out the large number of conductors necessary for encoding the position of the sliding bar switches would mean that the integrated circuit receiving the inputs would necessarily require an inordinately large capacity to be compatible with the required number of data input nodes. Therefore for domestic applications where minimum size and aesthetic appearance are important considerations, it has not been practical to implement the conventional sliding bar type arrangement, even though it provides the aesthetically pleasing, intuitively obvious indication of input setting.

Therefore, it is a principal object of the invention to provide the switching system for use in combination with an LCD data display devices which utilizes a sliding bar or movable switching element in combination with an array of conductors for intuitively indicating the setting of the switch within a given range and capable of providing resolution within the range which does not require a large number of additional conductors.

A further object of the invention is to provide a multiplex switching system which can be combined with existing conductors which drive visual display elements of an LCD digital data display system for indicating the actuation of a movable switch element of a touch pad keyboard.

It is yet another object of the invention to provide an electrical switch capable of inputting a large amount of data and which involves a minimal number of parts that are capable of compact arrangement.

SUMMARY OF THE INVENTION

The invention is carried out in combination with a data display system of the type having a plurality of display elements for visually indicating alphanumeric data in which the display elements have visually perceptible and imperceptible data indicating states and which are characterized by a lagging response to either the application or interruption of the actuating signal wherein a turn-on or turn-off transition interval elapses during a change from one state to the other with the preexisting state of the display element appearing to an observer to remain unchanged during the transition interval. An example of such a system is a digital data system of the liquid crystal display type having separate display elements arranged in groups for visually indicating alphanumeric data and a number of driver conductors connected to display elements for energizing them during a load energizing interval. According to the invention, the load actuating signals from the source to the display elements are periodically applied through one or more of the driver conductors during the load energizing interval and are interrupted during a sampling interval. The load energizing interval is preferably much longer in duration relative to the duration of the sampling interval, with the duration of the sampling interval being substantially less than the duration of the turn-off transition interval of the display elements. Each driver conductor is pulsed during the sampling interval with a strobe signal having a pulse component duration less than the turn-on time of the display elements. The strobe pulses are preferably applied sequentially and a count is generated by counting a number of repetitive events occurring during the interval commencing with the first application of a strobe pulse to a driver conductor and terminating with the application of a strobe pulse to the driver conductor engaged in electrical contact with the data input conductor through the movable switch element.

Liquid display elements typically exhibit a turn-on or turn-off transition interval of approximately a few hundredths of a second. The actuating signals are interrupted for a few thousandths of a second at which time the driver conductors are sequentially pulsed by strobe pulses having a pulse duration substantially less than the turn-on transition time of the display elements. Therefore, to an observer, the preexisting state of the display element appears to remain unchanged during the sampling interval. Those display elements which are energized and display a visually perceptable data state (dark) appear to remain unchanged in that state since the sampling interval is less than the turn-off time of the display elements. Those display elements which were off at the beginning of the sampling interval remain in the off condition, that is the imperceptible data indicating state (light), because the long turn-on time of the display elements render them substantially unresponsive to the relatively short duration strobe pulses.

According to an important aspect of the invention, the invention is carried out in combination with an electrical circuit or device which includes a number of existing conductors which constitute an array corresponding generally with the desired range of the positions of an adjustable switch or keyboard. An example of such an electrical circuit is a digital data display system of the type having separate display elements of the LCD type arranged in groups for visually indicating alphanumeric data and a number of driver conductors connected to the display elements for energizing them during a load energizing interval. However, the invention may be used in combination with a general array of conductors or with any electrical circuit which includes an array of conductors through which signals are transmitted for actuating any electrical load which exhibits a lagging response to the application or interruption of an actuating signal wherein a turn-on or turn-off transitional interval elapses during a change from one state to the other with the preexisting state of the load appearing to an observer to remain unchanged during the transition interval, whereby interruption or modification of the signal transmission may be carried out during a brief time interval without impairing the operation or function of the device or load receiving the signals.

According to another aspect of the invention, method and apparatus are provided for generating a digital data word representative of the position of a movable switch element or touch pad which is selectively engageable in discrete electrical contacting relation with any one of several LCD driver conductors disposed in an ordered array corresponding to the range of positions of the switch element. The method comprises the steps of pulsing each conductor of the array during a sampling interval having a relatively short duration compared to the turn-off transsition time of the LCD elements driven by the conductors while counting the pulses of a repetitively pulsed signal which occur in the interval commencing with the application of the first pulse to a conductor of the array and terminating with the application of a pulse to the conductor engaged by the movable switch element. The plurality of data bits representative of the number of pulses counted during the interval define a digital data word representative of the position of the movable switch element.

The method of the invention may be practiced in combination with a digital data system of the type having electro-optical display elements such as liquid crystal display elements having a relatively slow response to the application or interruption of an actuating signal, an electrical circuit having output nodes for driving the visual display elements, and driver conductors electrically connecting the data output nodes to the visual display elements. The driver conductors are utilized in a multiplex switching arrangement by combining with the driver conductors at least one data conductor in an orientation which permits electrical contact with the driver conductors. A movable switch element such as a slide switch or touch pad electrically connects the data input conductor to a selected one of the driver conductors with the movable switch element being adjustable for establishing a discrete electrical connection between the data input conductor and any selected one of the driver conductors. According to this arrangement, the number of driver conductors corresponds generally to the range of discrete positions of the movable conductor elements which in turn may correspond, for example, with the range of a variable quantity which is being controlled by a remote process. Control means are coupled to the data system for conducting actuating signals through one or more of the driver conductors to the visual display elements during a load energizing interval and a strobe generator is coupled to the driver conductors for sequentially pulsing each driver conductor with an electrical strobe signal during a strobe interval immediately following the load energizing interval. A control circuit is coupled to a counter for starting the count of the repetitively pulsed signal in response to the application of a strobe to one of the driver conductors and for latching the counter in response to a strobe pulse transmitted through the data input conductor to the electrical circuit. The plurality of data bits stored in the counter are representative of the number of pulses counted during the strobe interval and define a digital data word representative of the position of the movable switch element.

The foregoing and other objects, advantages and features of the invention will hereinafter appear, and for purposes of illustration, but not of limitation, an exemplary embodiment of the subject invention is shown in the appended drawing.

BRIEF DESCRIPTION OF THE DRAWING

FIG. 1 is a simplified block diagram of a digital data system incorporating features of the invention;

FIG. 3 is an elevation view, partly in section, of a portion of a slide switch which may be used in combination with the system shown in FIGS. 1 and 2;

FIG. 4 is a view of the slide switch of FIG. 3 taken along the lines IV—IV;

FIG. 5 is a perspective view of an electronic thermostat control unit which incorporates the invention;

FIGS. 6A–6H are graphical illustrations of the various timing and control signals generated by the system shown in FIGS. 1 and 2 for producing a digital data word representative of the position of a data input switch; and, FIG. 7 is a simplified schematic diagram of a touch pad keyboard for inputting data according to the method of the invention.

DETAILED DESCRIPTION OF THE PREFERRED EMBODIMENTS

Figure 2:
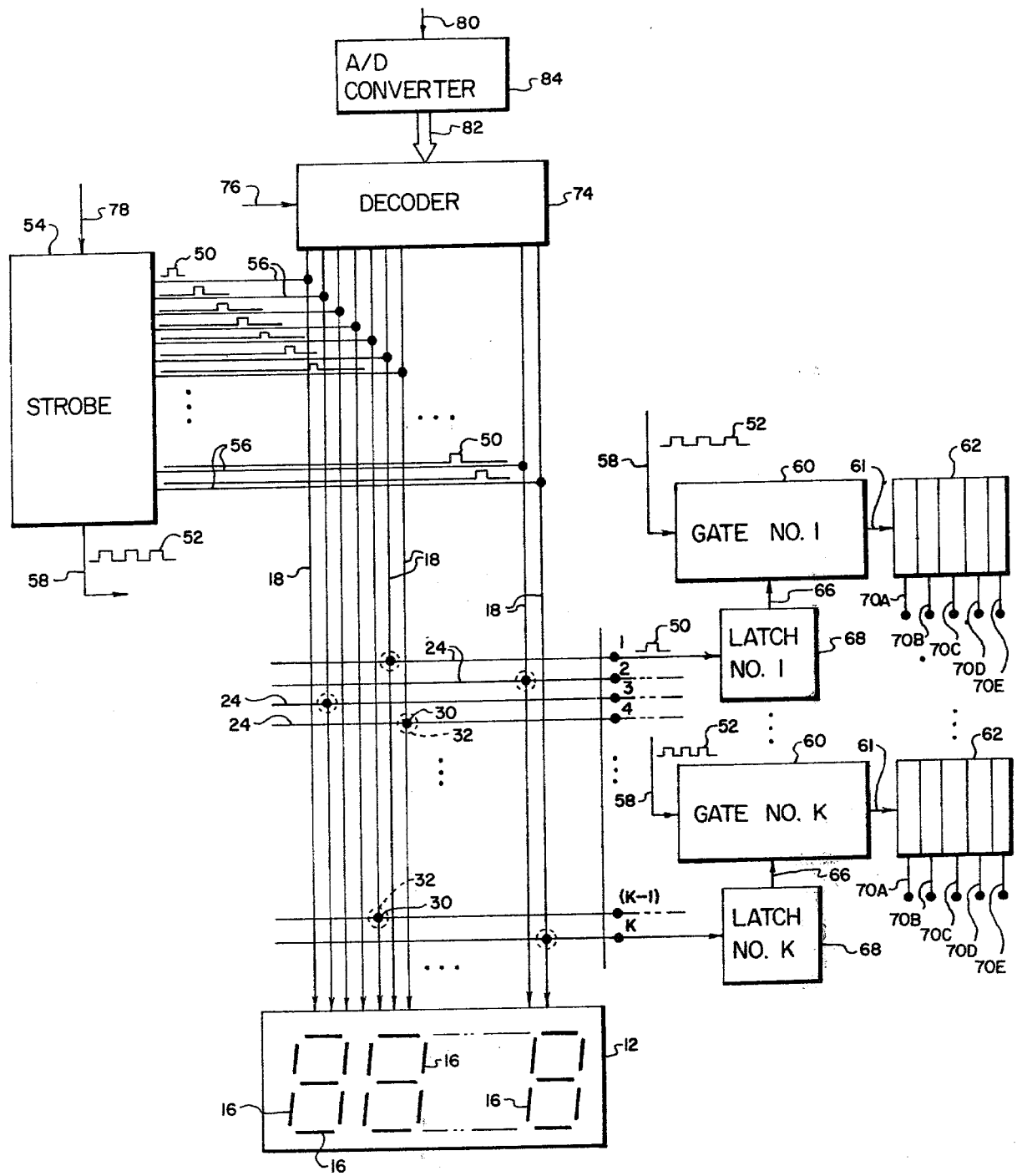
FIG. 2 is a block diagram which illustrates further details of the components of the digital data system shown in FIG. 1.

In the description which follows, like parts are marked throughout the specification and drawing with the same reference numerals, respectively. The drawing figures are not necessarily to scale and in some instances portions have been exaggerated in order to more clearly depict certain features of the invention.

For purposes of illustration, the invention will be described in combination with an electronic thermostatic control unit of the type shown in FIG. 5 having liquid crystal composption electro-optical display elements for visually indicating alphanumeric data. However, it should be understood that the various features of the invention may be used in combination with any apparatus in which an array of conductors is available for transmitting actuating signals to a load which exhibits a lagging response to the application or interruption of the actuating signals.

Referring to FIGS. 1 and 5, the invention is concerned with means for inputting a large amount of information into an integrated circuit 10 having output nodes 1, 2, ... N for driving a digital data display unit 12 and a plurality of input nodes 1, 2, ..., K for receiving data related to set point information, for example selection of daytime temperature, selection of nighttime temperature, etc. The purpose of providing such inputs is to save energy used in heating and cooling in a home or business environment by providing different temperature set points that can be selected automatically at appropriate times of the day or night.

The integrated circuit 10 and digital display unit 12 are incorporated in an electronic thermostatic control unit 14 as shown in FIG. 5. The display unit 12 includes a number of liquid crystal display (LCD) elements 16 arranged in the conventional seven segment pattern groups 17 for visually displaying alphanumeric data. The liquid crystal display elements 16 are energized through separate drive lines or driver conductors 18 which connect the output nodes 1, 2, ..., N to the corresponding liquid crystal display elements 16 in each seven segment group. Each of the LCD elements 16 preferably comprises a thin layer of lyotrophic nematic mesomorphic composition for diffusing light by molecular turbulence. Because of this molecular turbulence, LCD display elements exhibit a lagging response to either the application or interruption of an actuating signal, typically having turn-on and turn-off times of a few hundredths of a second to change from light to dark or dark to light. Therefore the preexisting state of the LCD elements 16 appear to remain unchanged during the transition interval. As shown in FIG. 5, the LCD display 16 elements are arranged to visually display time and temperature information.

The data input switch arrangement for the electronic thermostatic control unit 14 preferably includes a number of manually adjustable slide switch assemblies 20 for inputting and visually indicating data such as the set point for day temperature, night temperature, and the time for day-to-night transition and night-to-day transition. This set point information is utilized by remote control apparatus which may be, for example, a heating or cooling unit for air conditioning purposes.

According to the invention, the display driver conductors 18 not only drive the display unit 12 but also provide input for the slide switch assemblies 20 which are sampled periodically for set point information as will be described hereinafter. Set point information corresponding to the position of each slide switch assembly 20 is conducted to an input node (1, 2, ..., K) of the integrated circuit 10 by means of a return conductor 24. Electrical contact between the return conductor 24 and a selected one of the drive conductors 18 is provided by a wiper arm 26 of the slide switch assembly 20 as illustrated in FIG. 3. A conductive curved portion 28 of the wiper arm 26 engages a selected one of the driver conductors 18 in electrical contact with the point of engagement 30 being represented by a dot and enclosed by a dashed circle 32 in FIGS. 1 and 2.

As shown in FIGS. 3 and 4, the position of the slide switch assembly 20 is adjustable with the curved portion 28 of the wiper arm 26 being movable from conductor-to-conductor within the driver conductor array. The position of the switch assembly 20 is determined by the location of a ball bearing 34 which is displaced and lodged within adjacent detents 36 as a carriage member 38 in which it is confined is displaced by means of movement of a slide switch handle 39. The ball bearing 34 is further confined by a spring clip 40 with which it is resiliently engaged at all times. According to this arrangement, an electrically conductive path is established from the driver conductor 18 through the conductive curved portion 28 of the wiper arm 26 which is joined in electrical contact with a second wiper arm 42. The wiper arm 42 has a curved conductive portion 44 resiliently engaged in electrical contact with the return conductor 24 as shown in FIG. 4. Thus it will be apparent that as the slide switch handle 39 is moved through a slot 46 on the thermostatic control unit 14, a discrete electrical contact is made with each of the driver conductors 18 as they are engaged one-by-one by the wiper arm 26.

In this arrangement, the driver conductors 18 are existing driver conductors which interconnect the integrated circuit 10 with the digital data display unit 12. The driver conductors 18 are arranged in an ordered array and are embedded in a nonconductive substrate 48 with one major side surface exposed for engaging the conductive curved portion 28 of the wiper arm 26. For purposes of this specification the term "ordered array" means a group or set of conductors arranged relative to each other in an array, not necessarily in parallel relation, and not necessarily in coplanar relation, but physically spaced relative to each other to permit each conductor to be separately engaged by a movable element of a switch assembly, with adjacent conductors being sequentially engageable. The arrangement of the parallel, coplanar conductor array of primary or driver conductors 18 with the parallel, coplanar conductor array of secondary or return conductors 24 extending orthogonally with respect thereto is preferred. The combination of one or more return conductors 24 in transverse or orthogonal, spaced relation with the driver conductor array defines a switch conductor matrix having rows and columns formed by the return conductors 24 and the driver conductors 18, respectively, which cooperate with one or more movable assemblies 20 for visually indicating a number of data set points of an assigned function of interest, for example temperature, over a range with resolution of the function within the range being proportional to the number of columns or driver conductors in the matrix, and with the number of independent functions for which set point information is separately indicated being equal to the number of rows or return conductors 24 in the matrix.

The operation of the invention for generating a digital data word representative of the position of the movable switch assembly 20 will now be described with reference to FIG. 2 and FIGS. 6A through 6H. According to the method of the invention, the driver conductors are sequentially pulsed with a strobe signal 50 having a duration $\tau$ (FIG. 6D) while counting the pulses of a repetitively pulsed signal 52 which occur in the interval commencing with the application of the first strobe pulse 50 to the driver conductor 18 which connects the data output node number 1 to an LCD element 16 of the digital data display unit 12 and terminating with the application of a strobe pulse 50 to the driver conductor 18 which is engaged by the slide switch assembly 20 for a given return line 24.

The strobe signals 50 are produced by a strobe generator 54 and are applied to the driver conductors 18 through a corresponding number of strobe conductors 56 which are separately connected to each of the driver conductors 18. In this embodiment, the strobe generator 54 also produces the repetitive pulse signal 52 which is applied through a repetitive pulse conductor 58 to each one of a number of transmission gates 60. According to this arrangement, the pulse components of the repetitive pulse signal 52 are conveyed through the associated transmission gate 60 to a counter 62 until a latch signal 64 is applied to the transmission gate through a latch output conductor 66. The latch signal 64 is produced by a latch 68 in response to the occurrence of a strobe signal 50 on the associated return conductor 24 which also serves as its input. The counter 62 stores each pulse component of the repetitive pulse signal 52 which is conveyed through the transmission gate 60 during the interval commencing with the application of a strobe pulse 50 to the first driver conductor 18 and terminating with the application of a strobe pulse to the driver conductor which is engaged by the slide switch assembly 20. The occurrence of the strobe pulse 50 on the return conductor 24 produces the latch signal 64 which inhibits the gating of pulse components through the transmission gate 60. The data word representative of the count of the counter 62 comprises a plurality of data bits which appear as either a logic "one" voltage level or a logic "zero" voltage level on each of the data bit conductors 70A, 70B, 70C and 70D of the counter 62. Therefore the output of the counter 62 is uniquely representative of the number of pulse components counted which in turn corresponds to the position of the slide switch assembly 20.

If the repetitive pulse signal 52 is synchronized with the generation of the strobe pulses 50, then the digital data word defined by the counter 62 will be numerically equal to the number of driver conductors receiving the strobe pulse during the interval. On the other hand, if the frequency of the repetitive pulse signal 52 is greater than or less than the frequency at which the strobe pulses are applied, then the digital data word produced by the counter 62 will correspond in proportion to the ratio of the respective frequencies.

Figure 6A:
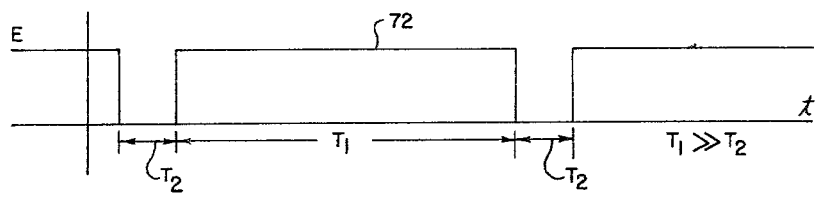

In the present example, an actuating signal 72 having an amplitude E is applied by the decoder 74 to selected ones of the LCD elements 16 during a load energizing interval $T_1$ as shown in FIG. 6A. The actuating signals 72 are selectively applied through a decoder and driver unit 74 which are alternately enabled during the load energizing interval $T_1$ and inhibited during a sampling interval $T_2$ at which time the strobe pulses 50 are applied. The load interval $T_1$ is preferably substantially longer in duration as compared with the duration of the sampling interval $T_2$, and the sampling interval $T_2$ is preferably substantially shorter in duration as compared with the duration of the turn-off transition interval of the LCD elements 16. The decoder 74 is enabled by means of a signal 76, and operation of the strobe generator 54 is enabled by a signal 78. Coordination of the decoder enable signal 76 and strobe generator enable signal 78 is carried out by conventional logic circuitry such as a MOS/LSI microprocessor (not shown). The load energizing interval $T_1$ may be, for example, two seconds and the strobe interval $T_2$ may be of relatively short duration, for example 10,000 microseconds.

Figure 6B:
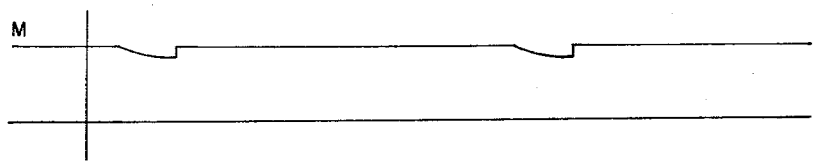
Figure 6D:
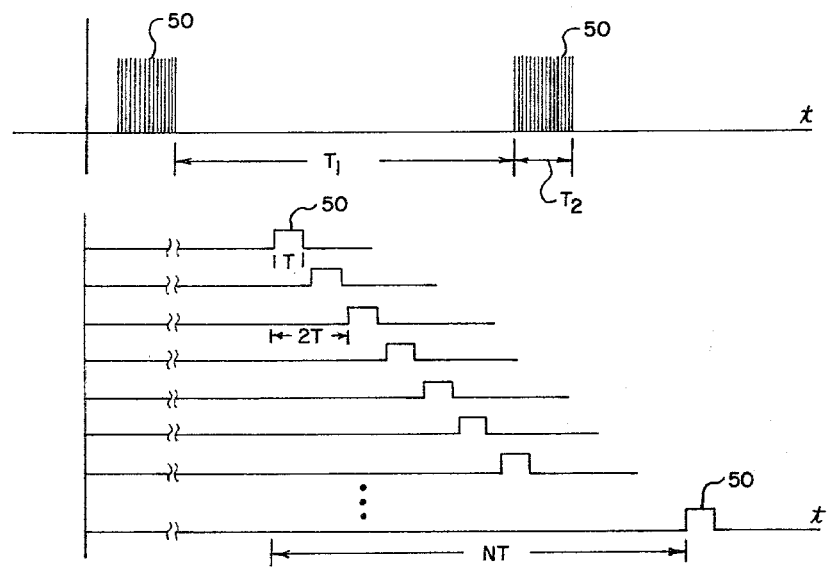
Figure 6E:
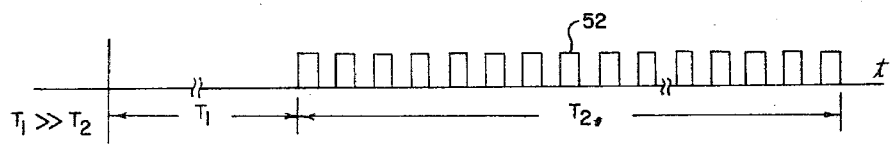
Figure 6F:
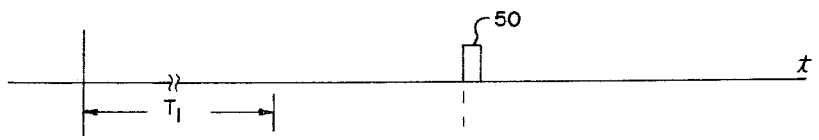
Figure 6H:
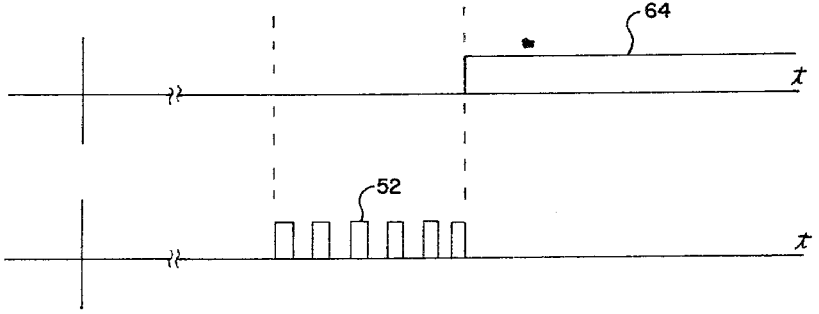

The sampling interval $T_2$ should be relatively short with respect to the duration of the load energizing interval $T_1$ in order to avoid interference with the visual presentation of data by the digital data display unit 12. Because the display elements 16 are of the liquid crystal variety, the visual effect made possible by the molecular activity M of the liquid crystal elements persists for a relatively long period after the energizing signal 72 is removed so that the display appears to be continuous even though the elements are periodically de-energized. As shown in FIG. 6B, the molecular activity M diminishes slightly during the interval $T_2$ The duration $\tau$ of the strobe pulse 50 is preferably substantially shorter than the duration of the turn-on transition interval of the display elements 16, so that those display elements which are in the "off" state prior to the application of the strobe signal 50 will remain in that state. The driver conductors 18 are thus utilized to perform two functions on a time sharing or multiplex basis: during a first interval, energizing the LCD elements of the digital data display unit 12, and during the strobe interval immediately following, conducting strobe pulses for generating a digital data word representative of the slide switch assembly.

As previously discussed, the digital data display unit 12 may display information in digital form such as time and temperature. In the arrangement shown in FIG. 2, an analog temperature signal 80 is converted into digital data 82 representative of the temperature signal by an analog-to-digital converter 84. The digital temperature signal 82 is decoded and scaled for proper presentation by the decoder and driver unit 74. Other data such as time of day may also be input through the decoder 74 for presentation on the digital data display unit 12.

Figure 7:
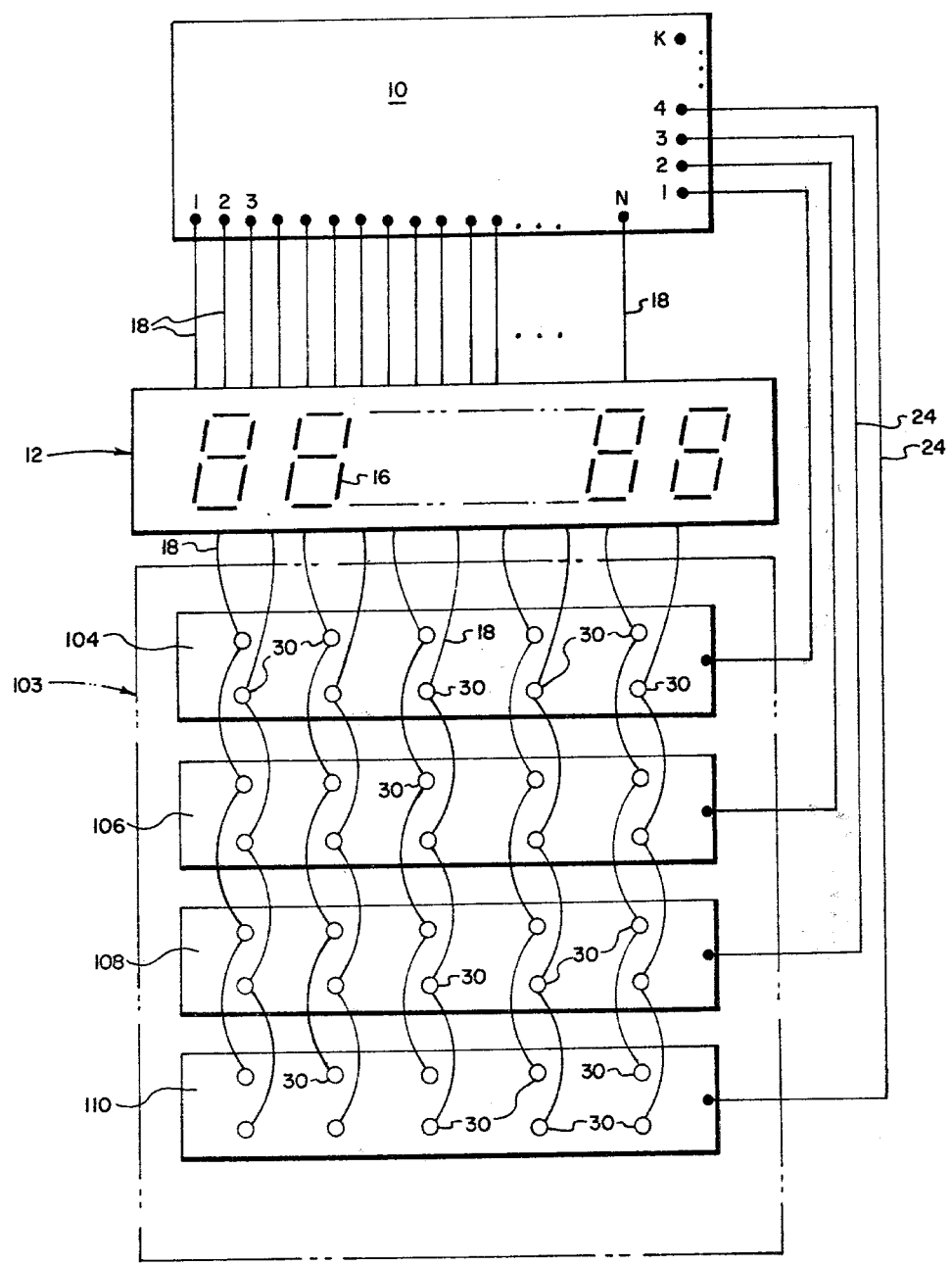

Although the foregoing discussion has been in reference to a slide switch assembly, it should be understood that the principles of the invention are equally applicable to other switching arrangements such as a keyboard 103 as illustrated in FIG. 7 wherein the switch elements 30 are touch pads which are coupled between the intersections of column and row conductors 18, 24 for selectively establishing a momentary electrical contact between the row and column conductors at each matrix location. The keyboard arrangement shown in FIG. 7 is a five-by-eight matrix of touch pads in which alternate touch pads in each column are connected in series relation with a separate driver conductor 18. Electrically conductive strips 104, 106, 108 and 110 are disposed beneath adjacent pairs of rows within the matrix. As any given touch pad 30 is depressed to close a circuit, the underlying conductive strip is contacted simultaneously as the touch pad is depressed, thereby transmitting a return signal through the associated conductor 24 back to the chip 10. When this return signal is received, the drive signals to the LCD element 16 are ground and each of the driver conductors 18 are strobed during a predetermined sample interval as previously discussed. In the preferred embodiment shown in FIG. 7, the backplane signal applied to the LCD elements serves as the return signal for initiating the strobe cycle. Information relating to the location of a particular switch element 30 which is depressed during the sampling interval is carried out by counting the number of strobe pulses which occur during the interval commencing with the application of a strobe pulse to the first driver conductor of the matrix and terminating upon the first occurrence of the application of a strobe pulse to a driver conductor engaged in electrical contact with the associated data input conductor through the movable switch element which is depressed during the sampling interval. With this arrangement, a digital data word representative of the position of each movable switch conductor throughout the row and column matrix locations may be determined. If the keyboard is interrogated at intervals from two to three times per second, the switch positions become digit-by-digit multiplexable and compatible for use in keyboard applications such as calculators.

It should be understood that the description of the foregoing example was limited to apparatus for processing data related to a single assigned input function (temperature) and that a practical embodiment incorporating the invention may include similar apparatus for processing data related to a plurality of assigned functions such as daytime temperature, nighttime temperature, day-to-night transition time, and night-to-day transition time. In such a practical embodiment of the invention, additional conventional processing apparatus may be required for carrying out the additional functions.

Although a preferred embodiment of the invention has been described in detail, it should be understood that various changes, substitutions and alterations can be made therein without departing from the spirit and scope of the invention as defined by the appended claims.

What is claimed is:

1. In combination:
   a data display device having liquid crystal display elements each characterized by a turn-on and turn-off transition interval;
   a data logic circuit having output nodes for conducting actuating signals to said liquid crystal display elements and having a data input node;
   driver conductors connecting said data logic output nodes to said display elements;
   a data input conductor connected to said data input node;
   a switch assembly including a movable switch element for electrically connecting the data input conductor to one of the driver conductors;
   a control circuit coupled to the data logic circuit for applying the actuating signals during a load interval and interrupting the actuating signals during a sampling interval, the load interval being longer than the sampling interval and the sampling interval having a duration which is less than the turn-off time of the liquid crystal display elements; and,
   sampling means coupled to said driver conductors and to said data input conductor for pulsing said driver conductors with an electrical strobe signal having a pulse duration less than the turn-on time of the liquid crystal display elements during said sampling interval and for counting a number of repetitive events occurring during the sampling interval commencing with the first application of a strobe pulse to a driver conductor and terminating with the application of a strobe pulse to the driver conductor engaged in electrical contact with the data input conductor through said movable switch element.

2. The combination as defined in claim 1 wherein said switch assembly comprises a slide switch and said movable switch element comprises a wiper arm which is movable from one of said conductors to another.

3. The combination as defined in claim 1 wherein said switch assembly comprises a keyboard and said movable switch element comprises a touch pad which is movable from a non-contacting position to a position of electrically contacting engagement between one of said driver conductors and one of said return conductors.

4. The combination as defined in claim 1 wherein the repetitive events comprise the strobe pulses.

5. The combination as defined in claim 1, wherein the repetitive events comprise a repetitive pulse signal, said combination including:
   means for generating the repetitive pulse signal;
   a counter coupled to said repetitive pulse signal generating means for counting the repetitive pulses and producing a plurality of data bits defining a data word representative of its count; and,
   said control circuit including means coupled to said counter for starting the counting of said repetitive pulses in response to the first application of a strobe pulse to a driver conductor and for latching said counter and storing the data word representative of its count in response to the transmission of a strobe pulse through the driver conductor engaged in electrical contact with said data input conductor through said movable switch element.

6. Matrix switch apparatus comprising:
   a digital data display device having a plurality of display elements for visually indicating alphanumeric data in response to an actuating signal, said display elements each having visually perceptible and imperceptible data indicating states and being characterized by a lagging response to either the application or interruption of the actuating signal wherein a turn-on or turn-off transition interval elapses during a change from one state to the other with the preexisting state of the display element appearing to an observer to remain unchanged during the transition interval;
   a data logic circuit having output nodes for conducting actuating signals and a data input node;
   a plurality of driver conductors electrically connecting said data output nodes to the data display elements;
   a data input conductor connected to said data input node;
   a movable switch element for electrically connecting the data input conductor to one of the driver conductors;
   a control circuit coupled to the data logic circuit for applying the actuating signals during a load interval and interrupting the actuating signals during a sampling interval, said load interval being longer in duration relative to the duration of the sampling interval, and the duration of the sample interval being less than the duration of the turn-off transition interval of the display elements;
   sampling means coupled to said driver conductors for pulsing each driver conductor during said sampling interval with a strobe signal having a pulse component duration less than the turn-on time of said display elements; and,
   counting means coupled to said sampling means and to said data input conductor for counting a number of repetitive events occurring during the interval commencing with the first application of a strobe pulse to a driver conductor and terminating with the application of a strobe pulse to the driver conductor engaged in electrical contact with the data input conductor through the movable switch element.

7. In a digital data display system of the type having a plurality of display elements for visually indicating alphanumeric data in response to an actuating signal, said display elements each having visually perceptible and imperceptible data indicating states and being characterized by a lagging response to either the application or interruption of the actuating signal wherein a turn-on or turn-off transition interval elapses during a change from one state to the other with the preexisting visual state of the display element appearing to an observer to remain unchanged during the transition interval, a data logic circuit having output nodes for driving said visual display elements and a data input node, and a plurality of driver conductors electrically connecting said data output nodes to said data display elements, the combination with said driver conductors of a data input conductor connected to said data input node, a movable switch element for electrically connecting the data input conductor to one of the driver conductors, a strobe generator electrically coupled to said driver conductors for pulsing each driver conductor with a strobe pulse having a duration which is less than the duration of the turn-on transition interval during a sampling interval having a duration which is less than the duration of the display element turn-off transition interval, a counter coupled to said strobe generator for counting the strobe pulses and producing a plurality of data bits defining a data word representative of its count, and control circuit means coupled to said data logic circuit, data input conductor and counter for interrupting the display actuating signals during said sampling interval and applying said strobe pulses to said driver conductors, starting the counting of the strobe pulses in response to the first application of a strobe pulse to a driver conductor, latching the counter and storing the data word representative of its count in response to the transmission of a strobe pulse through the data input conductor.

8. In apparatus having a plurality of driver conductors disposed in an array for conducting actuating signals to a group of display elements for visually indicating alphanumeric data, wherein each display element is characterized by a turn-on and turn-off transition interval, the combination with the driver conductor array of a plurality of data input conductors disposed for electrical connection with each of the primary conductors; a plurality of switch assemblies for visually indicating a number of data set points of one or more assigned functions, respectively, over a range with resolution of the function associated with a particular switch assembly within said range corresponding to the number of columns of driver conductors and the numner of assigned functions corresponding to the number of rows of data input conductors, each switch assembly including a movable switch element for electrically connecting a data input conductor to a selected one of the driver conductors, the position of said movable switch element being manually adjustable for one driver conductor to another for establishing a discrete electrical connection between its associated data input conductor and any selected one of the driver conductors, means for applying the actuating signals through the driver conductors during a load interval and interrupting the actuating signals during a sampling interval, wherein said load interval being much longer in duration relative to the duration of the sampling interval, and the duration of the sampling interval being less than the duration of the turn-off transition of the display elements; sampling means coupled to said driver conductors for pulsing said driver conductors during said sampling interval with a strobe signal having a pulse component duration less than the turn-on transition interval of said display elements; and for each assigned function, counting means coupled to said sampling means and to said data input conductors for counting a number of repetitive events occurring during the interval commencing with the first application of a strobe pulse to a driver conductor and terminating with the application of a strobe pulse to the driver conductor engaged in electrical contact with the data input conductor through the movable switch element corresponding with 9. In apparatus having a plurality of driver conductors disposed in an array for conducting actuating signals to a group of display elements for visually indicating alphanumeric data, wherein each display element is characterized by a turn-on and turn-off transition interval during which intervals the preexisting data-indicating state appears to remain unchanged, the combination with the driver conductor array of a plurality of data input conductors disposed for electrical contact with each of the primary conductors; said driver and data input conductors defining a conductor matrix having columns and rows formed by the driver conductors and data input conductors, respectively; a switch assembly having a movable conductor element electrically coupled between each intersection of the row and column conductors for selectively establishing a momentary electrical contact between the row and column conductors at each matrix intersection; means for applying the actuating signals through the driver conductors during a load interval and interrupting the actuating signals during a sampling interval, wherein said load interval being longer in duration relative to the duration of the sampling interval, and the duration of the sampling interval being less than the duration to the turn-off transition interval of the display elements; sampling means coupled to said driver conductors for pulsing each driver conductor during said sampling interval with a strobe signal having a pulse component duration less than the duration of the turn-on transition interval of said display elements; and for each row of data input conductors, counting means coupled to said sampling means and to said data input conductors for counting a number of repetitive events occurring during the interval commencing with the application of a strobe pulse to the first driver conductor of the matrix and terminating upon the first occurrence of the application of a strobe pulse of the sequence to a driver conductor engaged in electrical contact with the associated data input conductor through one of the movable switch elements in the corresponding row.

10. In electrical apparatus having a plurality of data display elements, a data transmission circuit for generating a plurality of data signals representative of alphanumeric data, and a plurality of driver conductors interconnecting the data transmission circuit with the data display elements, the combination of a control circuit coupled to said data transmission circuit for interrupting the data signals during a scan interval having a duration which is less than the turn-off time of the data display elements, a strobe circuit coupled to said driver conductors for pulsing the driver conductors with an electrical strobe signal having a pulse duration less than the turn-on time of the data display elements, and a counting circuit coupled to said strobe circuit and to a selected one of the driver conductors for counting the number of strobe pulses applied during the scan interval commencing with the first application of a strobe pulse to a driver conductor and terminating with the application of a strobe pulse to said selected driver conductor.

11. A method for generating a digital data word representative of the position of a movable switch element which is selectively engageable in discrete contacting relation with one of a plurality of driver conductors which are utilized for conducting actuating signals from a source to a data display system of the type having a plurality of display elements for visually indicating alphanumeric data, each display element having visually perceptible and imperceptible data indicating states and being characterized by a lagging response to either the application or interruption of the actuating signal wherein a turn-on or turn-off transition interval elapses during a change from one state to the other with the preexisting state of the display element appearing to an observer to remain unchanged during the transition interval, said method comprising the steps:

applying the load actuating signals from said source to the display elements of the data display system through one or more of said driver conductors during a load energizing interval and interrupting the load actuating signals during a sampling interval, said load energizing interval being much longer in duration relative to the duration of the sampling interval, and the duration of the sampling interval being less than the duration of the turn-off transition interval of the display elements;

pulsing said driver conductors during said sampling interval with a strobe signal having a pulse component duration less than the turn-on time of said display elements;

counting a number of repetitive events occuring during the interval commencing with the first application of a strobe pulse to a driver conductor and terminating with the application of a strobe pulse to the driver conductor engaged in electrical contact with the data input conductor through the movable switch element; and, producing a plurality of data bits representative of the number of repetitive events counted during said sampling interval.

12. The method as defined in claim 11, including the step of establishing each conductor at a common potential level prior to applying said strobe pulses and wherein each driver conductor is sequentially pulsed from said common potential level to a different potential level.

13. A method for generating a digital data word representative of the row and column location of a switch element in a switch matrix having conductor elements coupled between the intersections of row and column conductors for selectively establishing a momentary electrical contact between the row and column conductors at each matrix intersection wherein said column conductors are also utilized for conducting actuating signals from a source to a data display system of the type having a plurality of display elements for visually indicating alphanumeric data, said display elements being characterized by a lagging response to either the application or interruption of the actuating signal wherein a turn-on or turn-off transition interval elapses during a change from one state to the other with the preexisting visual state continuing during the transition interval, said method comprising the steps:

applying the actuating signals through the driver conductors during a load interval and interrupting the actuating signals during a sampling interval, said load interval being longer in duration relative to the duration of the sampling interval, and the duration of the sampling interval being less than the duration of the turn-off transition interval of the display elements;

pulsing each driver conductor during said sampling interval with a strobe signal having a pulse component duration less than the duration of the turn-on transition interval of said display elements;

for each row of data input conductors, counting a number of repetitive events occurring during the interval commencing with the application of a strobe pulse to the first driver conductor of the matrix and terminating upon the first occurrence of the application of a strobe pulse of the sequence to a driver conductor engaged in electrical contact with the associated data input conductor through one of the movable switch elements in the corresponding row; and, producing a plurality of data bits representative of the number of repetitive events counted during the sampling interval for each row.

* * * * *